United States Patent
Yoshida

(10) Patent No.: US 7,500,168 B2
(45) Date of Patent: *Mar. 3, 2009

(54) DECODER AND DECODING METHOD FOR DECODING LOW-DENSITY PARITY-CHECK CODES WITH PARITY CHECK MATRIX

(75) Inventor: Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 438 days.

This patent is subject to a terminal disclaimer.

(21) Appl. No.: 11/168,329

(22) Filed: Jun. 29, 2005

(65) Prior Publication Data

US 2006/0005105 A1    Jan. 5, 2006

(30) Foreign Application Priority Data

Jun. 30, 2004    (JP)    ............................. 2004-193767

(51) Int. Cl.
*H03M 13/00*    (2006.01)

(52) U.S. Cl. ........................ 714/752; 714/786; 714/799

(58) Field of Classification Search .................. 714/752, 714/758, 799, 786

See application file for complete search history.

(56) References Cited

U.S. PATENT DOCUMENTS

| | | | |
|---|---|---|---|
| 6,633,856 B2 | 10/2003 | Richardson et al. | |
| 7,178,081 B2 * | 2/2007 | Lee et al. ..................... | 714/752 |
| 7,178,880 B2 * | 2/2007 | Andersen ............... | 301/35.627 |
| 7,181,676 B2 * | 2/2007 | Hocevar ..................... | 714/780 |
| 2003/0037298 A1 | 2/2003 | Eleftherious | |
| 2004/0019845 A1 | 1/2004 | Eroz et al. | |
| 2004/0028002 A1 | 2/2004 | Eroz et al. | |

(Continued)

FOREIGN PATENT DOCUMENTS

EP    1 093 231 A1    4/2001

(Continued)

OTHER PUBLICATIONS

Gunnam, Kiran et al., "An LDPC decoding schedule for memory access reduction", Proc., IEEE International Conference on Acoustics, Speech, and signal processing, ICASSP, 04, Montreal, Quebec, Canada, vol. 5, May 17-21, 2004, pp. 173-176, XP010718893.

(Continued)

*Primary Examiner*—Esaw T Abraham
(74) *Attorney, Agent, or Firm*—Pillsbury Winthrop Shaw Pittman, LLP

(57) ABSTRACT

In an LDPC-code decoder, bit-processing units are provided, respectively, for the $1^{st}$ to Mth rows of the parity-check matrix that is formed of (r×s) permuted matrices having respective arrays of (m×m). Each of bit-processing units sequentially updates bit information corresponding to column positions included in the respective rows of the parity-check matrix, a bit at each of the column positions being set to "1".Parity-processing units update parity information corresponding to row positions in columns of each column block of the parity-check matrix, whenever the bit-processing units have finished bit update computation for m column positions in each column block, a bit at each row position being set to "1".The bit-processing units starts next bit update computation after the parity-processing units finish parity update computation for m columns of the first column block of the parity-check matrix.

10 Claims, 7 Drawing Sheets

U.S. PATENT DOCUMENTS

2004/0093554 A1     5/2004     Hung
2004/0153938 A1     8/2004     Okamura et al.
2005/0229087 A1*   10/2005   Kim et al. .................. 714/800

FOREIGN PATENT DOCUMENTS

JP          2002-033670      1/2002
WO     WO 03/032499 A1   4/2003

OTHER PUBLICATIONS

Chen, Yanni et al., "High Throughput Overlapped message Passing for Low Density Parity Check Codes", Proc., ACM/IEEE Great Lakes Sysmposium on VLSI, Washington, Apr. 28-29, 2004, pp. 245-248, XP009054620.

Chen, Yanni et al., "Overlapped Message Passing for Quasi-Cyclic Low Density Parity Check Codes", IEEE Transactions on Circuits and Systems-I: regular papers, vol. 51, No. 6, Jun. 1, 2004, pp. 1106-1113, XP002347303.

Yeo, Engling et al., "Iterative decoder architectues", IEEE Communications Magazine, vol. 41, No. 8. Aug. 2003, pp. 132-140, XP001177712.

Zhang, Tong et al, "An FPGA implementation of (3-6)-Regular Low Density Parity-Check Code Decoder", EURASIP Journal of applied signal processing, Hindawi Publishing Co., vol. 14, No. 2, Jun. 2003, pp. 530-542, XP002329888.

Andrew J. Blanksby et al., "A 690-mW 1-Gb/s 1024-b, Rate-1/2 Low Density Parity-Check Code Decoder", IEEE Journal of Solid-State Circuits, vol. 37, No. 3, Mar. 2002, pp. 404-412.

Japanese Office Action dated Nov. 18, 2008 for Appln. No. 2004-193767.

\* cited by examiner

| Cycle | HCALC | | | VCALC | |
|---|---|---|---|---|---|
| | Input for addition | Input for subtraction | Output | Input | Output |
| 1 | Q1,1, Q2,1, Q3,1 | - | - | - | - |
| 2 | Q1,2, Q2,2, Q3,2 | - | - | - | - |
| 3 | Q1,3, Q2,3, Q3,3 | - | - | - | - |
| 4 | Q1,4, Q2,4, Q3,4 | - | - | - | - |
| 5 | Q1,5, Q2,5, Q3,5 | - | - | - | - |
| 6 | - | Q1,1, Q2,1, Q3,1 | R1,1, R2,1, R3,1 | | |
| 7 | - | Q1,2, Q2,2, Q3,2 | R1,2, R2,2, R3,2 | | |
| 8 | Q'1,1, Q'2,1, Q'3,1 | Q1,3, Q2,3, Q3,3 | R1,3, R2,3, R3,3 | R1,1, R2,1, R3,1 | Q'1,1, Q'2,1, Q'3,1 |
| 9 | Q'1,2, Q'2,2, Q'3,2 | Q1,4, Q2,4, Q3,4 | R1,4, R2,4, R3,4 | R1,2, R2,2, R3,2 | Q'1,2, Q'2,2, Q'3,2 |
| 10 | Q'1,3, Q'2,3, Q'3,3 | Q1,5, Q2,5, Q3,5 | R1,5, R2,5, R3,5 | R1,3, R2,3, R3,3 | Q'1,3, Q'2,3, Q'3,3 |
| 11 | Q'1,4, Q'2,4, Q'3,4 | - | - | R1,4, R2,4, R3,4 | Q'1,4, Q'2,4, Q'3,4 |
| | | | | R1,5, R2,5, R3,5 | Q'1,5, Q'2,5, Q'3,5 |

F I G. 5

US 7,500,168 B2

DECODER AND DECODING METHOD FOR DECODING LOW-DENSITY PARITY-CHECK CODES WITH PARITY CHECK MATRIX

CROSS-REFERENCE TO RELATED APPLICATIONS

This application is based upon and claims the benefit of priority from prior Japanese Patent Application No. 2004-193767, filed Jun. 30, 2004, the entire contents of which are incorporated herein by reference.

BACKGROUND OF THE INVENTION

1. Field of the Invention

The present invention relates to a decoder and decoding method for decoding low-density parity-check codes with parity check matrices.

2. Description of the Related Art

Attention has recently been paid to low-density parity-check codes (LDPC codes) used as error detection and correction codes. Message-passing algorithms are known as a technique for decoding LDPC codes from, for example, Andrew J. Blanksby and Chris J. Howland, "A 690-mW 1-Gb/s 1024-b, Rate-½ Low-Density Parity-Check Code Decoder", IEEE Journal of Solid-State Circuits, Vol. 37, No. 3, pp. 404-412, March 2002. In the message-passing algorithms, to decode LDPC codes, bit update computation, which is performed for each row of a check matrix (parity-check matrix), and parity update computation, which is performed for each column of the matrix, are iteratedly executed.

When decoding LDPC codes using the message-passing algorithms, bit update computation and parity update computation depend upon each other. Therefore, in the prior art, parity update computation of one loop cannot be started unless bit update computation of one loop is finished, and bit update computation of the next loop cannot be started unless parity update computation of the one loop is finished.

BRIEF SUMMARY OF THE INVENTION

In accordance with an embodiment of the invention, there is provided a low-density parity-check code decoder. The low-density parity-check code decoder comprises (r×m) bit-processing units, m parity-processing units and a controller. The (r×m) bit-processing units are configured to perform bit update computation for sequentially updating bit information corresponding to column positions included in the respective rows of a parity-check matrix, the parity-check matrix being formed of (r×s) permuted matrices each having an array of (m×m) and being divided into s column blocks, a bit at each of the column positions being set to "1". The m parity-processing units are configured to perform parity update computation for updating parity information corresponding to row positions in m columns of each column block of the parity-check matrix, a bit at each of the row positions being set to "1". The controller is configured to cause, whenever the (r×m) bit-processing units have finished bit update computation for m column positions in the respective rows of the parity-check matrix, the m parity-processing units to perform parity update computation corresponding to m columns of one of the s column blocks to which the m column positions belong. Further, the controller is configured to cause, after the parity-processing units finish parity update computation for m columns of a first one of the s column blocks, the (r×m) bit-processing units to start next bit update computation.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a view illustrating information input and output in each cycle during bit update computation by the bit-processing units 10-1 to 10-M and parity update computation by the parity-processing units 20-1 to 20-$m$;

DETAILED DESCRIPTION OF THE INVENTION

Figure 1:
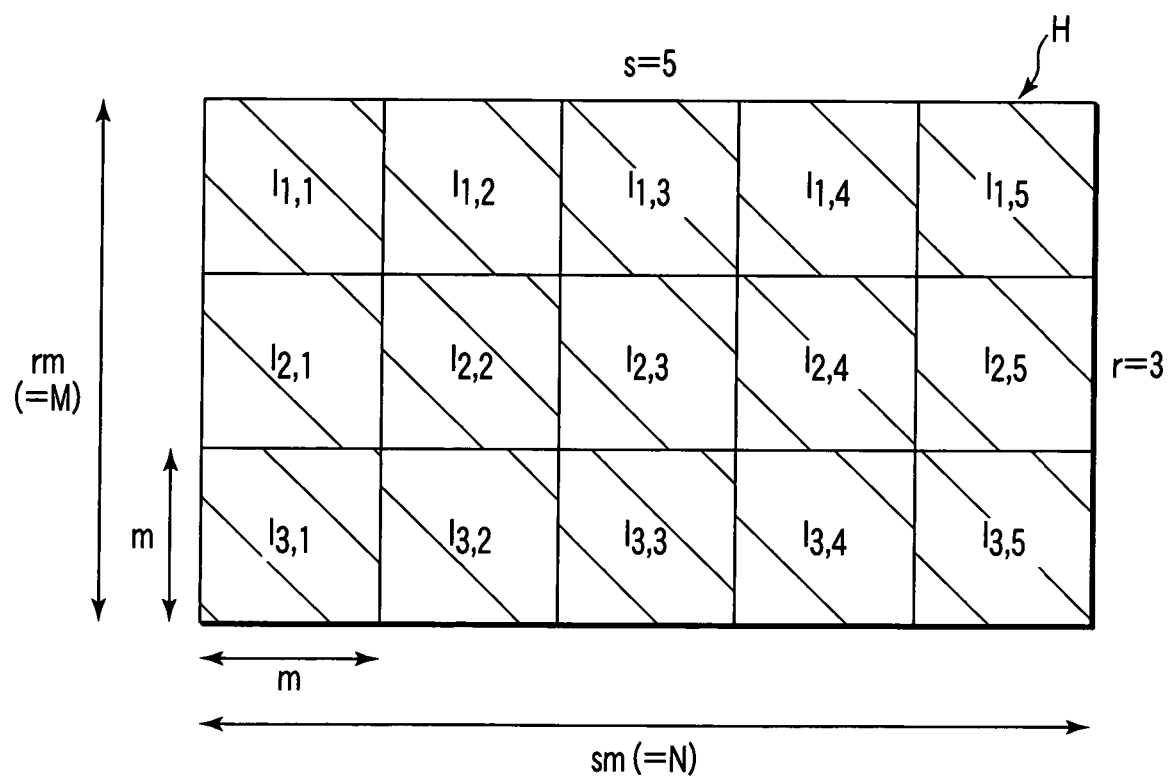
FIG. 1 is a view illustrating the structure of a parity-check matrix H employed in an embodiment of the invention.

An embodiment of the invention will be described with reference to the accompanying drawings. Firstly, a description will be given of a parity-check matrix H of low-density parity-check codes (LDPC codes) employed in the embodiment. As shown in FIG. 1, the parity-check matrix H is an array of (r×s) permuted matrices $I_{g,h}$ ($g=1, 2, \ldots, r$; $h=1, 2, \ldots, s$). Each permuted matrix $I_{g,h}$ is a sub-matrix of the check matrix H. Each permuted matrix $I_{g,h}$ is acquired by iterating, a number of times, exchange of two different rows or columns included in unit matrices I each having an array of (m×m). In this case, the number M of rows of the check matrix H is rm, and the number N of columns of the matrix H is sm. In the example of FIG. 1, r=3 and s=5. Further, the check matrix H is divided into s column blocks (i.e., the $1^{st}$ to the $s^{th}$ column blocks). Permuted matrices $I_{1,h}$, $I_{2,h}$ and $I_{3,h}$ belong to the $h^{th}$ column block.

The check matrix H contains M (=rm) parity nodes, and N (=sm) bit nodes. This check matrix H is constructed, assuming that the LDPC code is N (=sm) bits. The $j^{th}$ bit ($j=1, 2, \ldots, N$) of the LDPC code is represented by $x_j$. As already known, each row of the check matrix H can be regarded as a parity-check equation. The parity-check equation corresponding to the $i^{th}$ row of the check matrix H is called an $i^{th}$ parity-check equation. The N-bit LDPC code must satisfy all parity-check equations of the check matrix H, i.e., the first to the $M^{th}$ parity-check equations.

The oblique lines in each permutated matrix $I_{g,h}$ indicate the locus of the positions of "1" bits. As is evident from FIG. 1, only one "1" bit exists in each row and each column of {3(r)×5(s)} permutated matrices that provide the check matrix H. Accordingly, the numbers of "1" bits contained in each row and each column of the check matrix H are s and r, respectively. r and s are set to satisfy r<s. Accordingly, the number of "1" bits in each row is greater than that in each column.

To decode each LDPC code using the message-passing algorisms, it is necessary, in general, to iterate bit update computation and parity update computation.

Generally, bit update computation can be expressed by the following equation:

$$r_{i,j} = -\prod_{j' \in M(i) \setminus j} \text{sgn}(q_{i,j'}) \psi\left(\sum_{j' \in M(i) \setminus j} \psi(q_{i,j'})\right) \quad (1)$$

In the above equation, $r_{i,j}$ is acquired by passing corresponding parity information (reliability information) $q_{i,j}$ to each bit of the $i^{th}$ row of the check matrix H (except for the $j^{th}$ bit in the $i^{th}$ row). $r_{i,j}$ is bit information (reliability information) indicating reliability concerning code bit $x_j$ corresponding to the $j^{th}$ bit in the $i^{th}$ row. Assume here that $r_{i,j}$ does not indicate the probability itself that code bit $x_j$ is 0 or 1, but the logarithmic value of the probability. The reason why such a logarithmic value is used is that it enables multiplication/division to be replaced with addition/subtraction.

M(i) represents a set of column positions of "1" bits in the $i^{th}$ row of the check matrix H. M(i)\j represents M(i) except for j. j'∈ M(i)\j represents an arbitrary column position included in M(i) except for j. $q_{i,j'}$ is parity information (reliability information) indicating reliability concerning code bit $x_{j'}$, corresponding to the $j'^{th}$ bit in the $i^{th}$ row of the check matrix H. Assume that $q_{i,j'}$ does not indicate the probability itself that code bit $x_{j'}$ is 0 or 1, but the logarithmic value of the probability.

sgn $(q_{i,j'})$ represents the sign of $q_{i,j'}$. The sign of $q_{i,j'}$ is represented by the most significant bit MSB of $q_{i,j'}$. If $q_{i,j'}$ is negative, sgn $(q_{i,j'})$=−1, and MSB $(q_{i,j'})$=1. In contrast, if $q_{i,j'}$ is not negative, i.e., if it is 0 or positive, sgn $(q_{i,j'})$=+1, and MSB $(q_{i,j'})$=0. $\psi()$ represents a function (hereinafter referred to as "ψ function") for probability computation.

Further, parity update computation is expressed by the following equation:

$$q_{i,j} = p_j + \sum_{i' \in N(j) \setminus i} r_{i',j} \quad (2)$$

In the above equation (2), $q_{i,j}$ is acquired by passing, from a certain bit node to a corresponding parity node, bit information (reliability information) $r_{i',j}$ corresponding to each bit of the $j^{th}$ column of the check matrix H (except for the $i^{th}$ bit in the $j^{th}$ column). $q_{i,j}$ is parity information (reliability information) indicating reliability concerning code bit $x_j$ corresponding to the $j^{th}$ bit in the $i^{th}$ row of the check matrix H. $q_{i,j}$ is used as the above-mentioned $q_{i,j'}$ for bit update computation expressed by the equation (1).

$p_j$ represents the logarithmic value of the probability (initial probability) that the $j^{th}$ bit $x_j$ is 1 or 0, which is estimated from an LDPC code when it is output through a communication channel. The initial value of $q_{i,j}$ corresponding to each "1" bit in the check matrix H is identical to $p_j$.

N(j) represents a set of row positions of "1" bits in the $j^{th}$ column of the check matrix H. N(j)\i represents N(j) except for i. i'∈ N(j)\i represents an arbitrary row position included in N(j) except for i. $r_{i',j}$ is bit information (reliability information) indicating reliability concerning the $j^{th}$ bit $x_j$ in the $i^{th}$ row of the check matrix H. $r_{i,j}$ updated by computation using the equation (1) is used as $r_{i',j}$.

Figure 2:
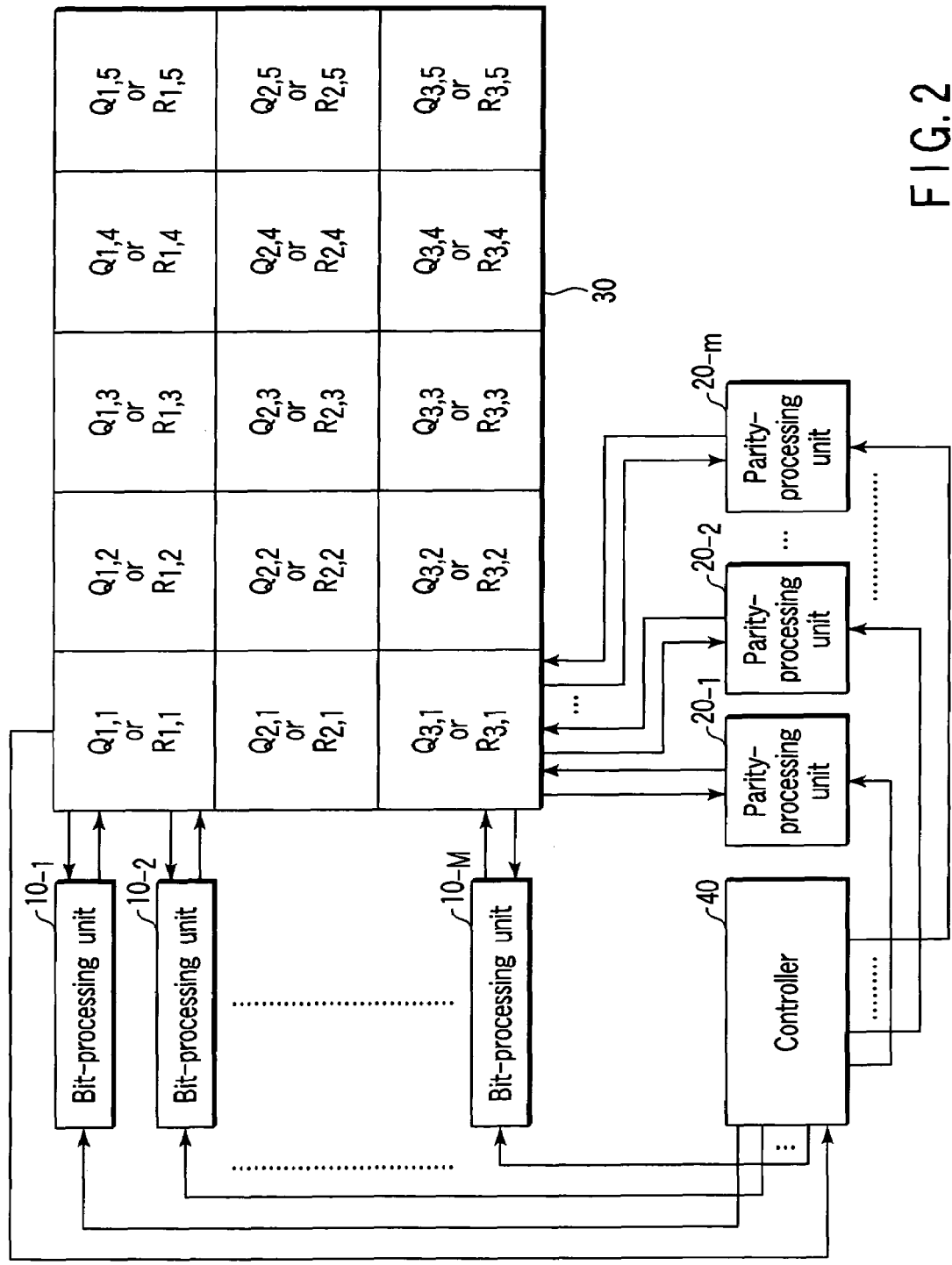
FIG. 2 is a block diagram illustrating the configuration of an LDPC-code decoder according to the embodiment.

FIG. 2 is a block diagram illustrating the configuration of an LDPC-code decoder according to the embodiment. As shown in FIG. 2, the LDPC-code decoder comprises M (=rm=3m) bit-processing units 10-1 to 10-M, m parity-processing units 20-1 to 20-m, a memory 30 and a controller 40. The bit-processing units 10-1 to 10-M are provided for the first to $M^{th}$ rows of the check matrix H, respectively. Each bit-processing unit 10-i (i=1, 2, . . . , M) executes bit update computation, expressed by the equation (1), on the $i^{th}$ row of the check matrix H.

The parity-processing units 20-1 to 20-m are common units used for all permuted matrices $I_{g,h}$, and provided for the first to $m^{th}$ columns of each permuted matrix $I_{g,h}$. Concerning h (=1, 2, . . . , s; s=5 in the embodiment), each parity-processing unit 20-k (k=1, 2, . . . m) is used to perform parity update computation on the $((h-1)m+k)^{th}$ column in the check matrix H, to which the $k^{th}$ column of each permuted matrix $I_{g,h}$ belongs. Namely, in the embodiment wherein s=5, each parity-processing unit 20-k is used to perform parity update computation on the $k^{th}$ column, $(m+k)^{th}$ column, $(2m+k)^{th}$ column, $(3m+k)^{th}$ column and $(4m+k)^{th}$ column of the check matrix H. The parity-processing unit 20-1, for example, is used to perform parity update computation on the first column, $(m+1)^{th}$ column, $(2m+1)^{th}$ column, $(3m+1)^{th}$ column and $(4m+1)^{th}$ column of the check matrix H. Similarly, the parity-processing unit 20-m, for example, is used to perform parity update computation on the $m^{th}$ column, $2m^{th}$ column, $3m^{th}$ column, $4m^{th}$ column and $5m^{th}$ column (the $N^{th}$ column) of the check matrix H.

The memory 30 is used to store bit information and parity information. The bit information is calculated by the bit-processing units 10-1 to 10-M. The parity information is calculated by the parity-processing units 20-1 to 20-m. Assume here that the memory 30 is formed of (3×5) (=r×s) memory units corresponding to (3×5) (=r×s) permuted matrices included in the check matrix H, i.e., $I_{1,1}$, $I_{2,1}$, $I_{3,1}$, $I_{1,2}$, $I_{2,2}$, $I_{3,2}$, I1,3, $I_{2,3}$, $I_{3,3}$, $I_{1,4}$, $I_{2,4}$, $I_{3,4}$, $I_{1,5}$, $I_{2,5}$ and $I_{3,5}$. The (3×5) memory units can be simultaneously accessed. The state of the storage area of the memory 30 corresponding to each of permuted matrices $I_{g,h}$ is represented by $Q_{g,h}$ or $R_{g,h}$. $Q_{g,h}$ indicates that parity information is stored in a storage area of the memory 30 corresponding to $Q_{g,h}$. $R_{g,h}$ indicates that bit information is stored in a storage area of the memory 30 corresponding to $R_{g,h}$.

The controller 40 controls decoding processing of an LDPC code input to the LDPC-code decoder. Specifically, the controller 40 functions as a sequencer for controlling the operations of the bit-processing units 10-1 to 10-M and parity-processing unit 20-1 to 20-m.

Figure 3:
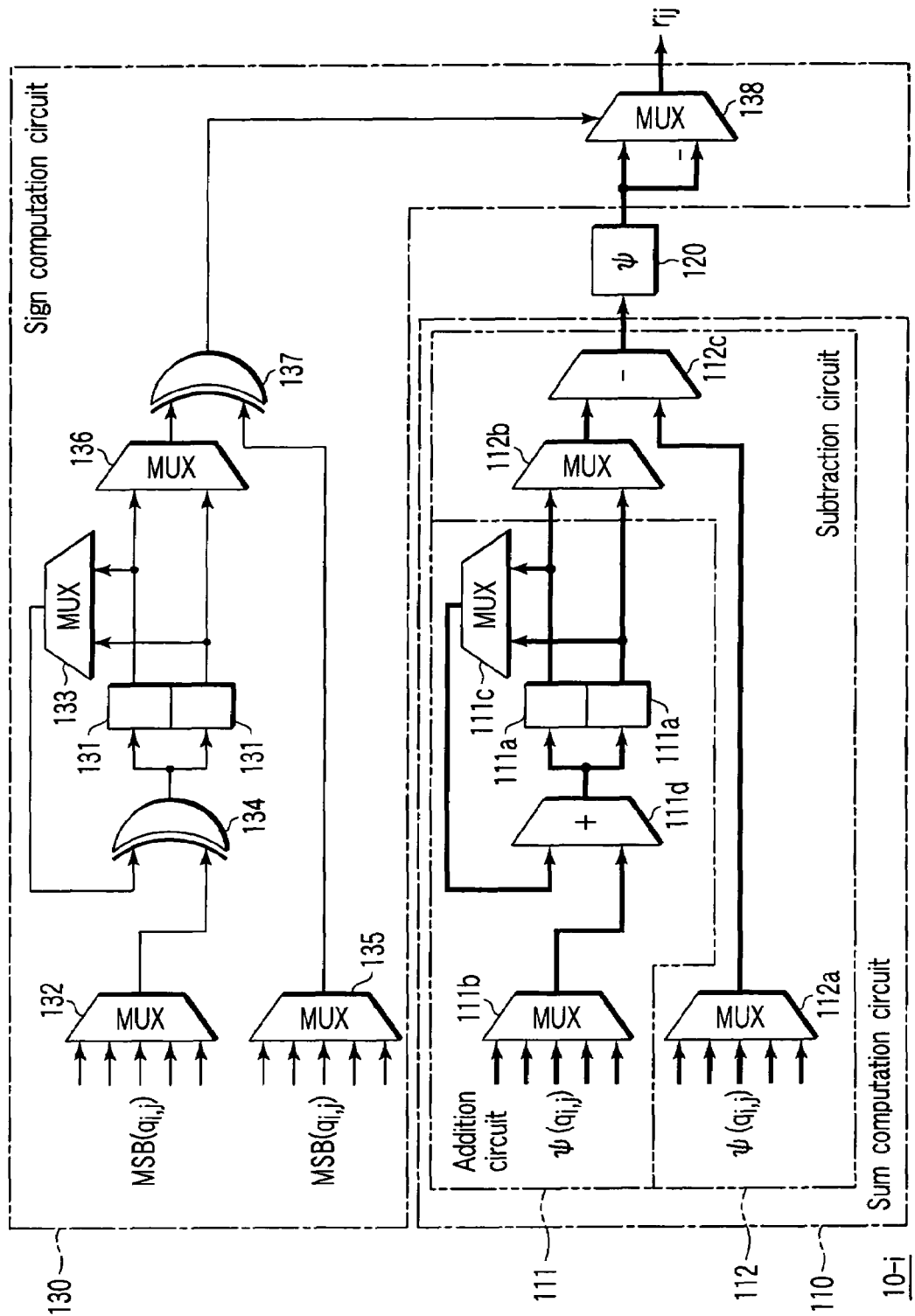
FIG. 3 is a block diagram illustrating the configuration of the bit-processing unit $10\text{-}i$ ($i=1, 2, \ldots, M$) appearing in FIG. 2.

FIG. 3 is a block diagram illustrating the bit-processing unit 10-i (i=1, 2,.., M) appearing in FIG. 2. Bit update computation expressed by the equation (1) mainly comprises a product part of Π operation, a ψ function part and a summation part of Σ operation. The ψ function part, i.e., the ψ( ) operation, can be realized using a lookup table. In light of this, the bit-processing unit 10-i is formed of a summation computation circuit 110, lookup table (LUT) 120 and sign computation circuit 130. The summation computation circuit 110 corresponds to the summation part. The lookup table 120 and sign computation circuit 130 correspond to the ψ function part and product part, respectively.

The summation part can be divided into an adder section and subtracter section. The adder section calculates the sum of $\psi(q_{i,j})$ values corresponding to positions j in the $i^{th}$ row of the check matrix H, at which the bit is set to "1". The subtracter section subtracts, from the sum calculated by the adder section, $\psi(q_{i,j})$ corresponding to position j in the $i^{th}$ row at which the bit is set to "1". In light of this, in the embodiment, the summation computation circuit 110 is formed of an addition circuit 111 and subtraction circuit 112.

The addition circuit 111 comprises a pair of registers 111a, multiplexers (MUX) 111b and 111d, and adder 111d. The registers 111a are used to hold the intermediate result (or final result) of addition processing for calculating the sum of $\psi(q_{i,j})$ values. The final result of addition processing is the last intermediate result, and indicates the sum of $\psi(q_{i,j})$ values. When one of the registers 111a holds the sum of $\psi(q_{i,j})$ values, the other register 111a is used to hold a new intermediate result of addition processing used for calculating a new sum of $\psi(q_{i,j})$ values. Thus, the functions of the registers 111a as respective registers for holding the sum and the intermediate result of $\psi(q_{i,j})$ values are switched each time the sum of $\psi(q_{i,j})$ values is calculated.

The multiplexer 111b sequentially selects $\psi(q_{i,j})$ corresponding to each position (column position) j in the $i^{th}$ row of the check matrix H, at which the bit is set to "1". Position j in the $i^{th}$ row of the check matrix H, at which the bit is set to "1", can be determined uniquely in units of rows. Accordingly, $\psi(q_{i,j})$ corresponding to position j in the $i^{th}$ row at which the bit is set to "1" can be determined uniquely. The multiplexer 111c selects the intermediate result (the result of the preceding addition process) held by one of the registers 111a. The adder 111d adds $(q_{i,j})$ selected by the multiplexer 111b to the intermediate result selected by the multiplexer 111c. The addition result of the adder 111d indicates a new intermediate result of addition processing for calculating the sum of $\psi(q_{i,j})$ values. The intermediate result held by the register 111a and used for addition of the adder 111d is updated to the addition result of the adder 111d, i.e., the new intermediate result of addition processing for calculating the sum of $\psi(q_{i,j})$ values.

As described above, the multiplexer 111b sequentially selects $\psi(q_{i,j})$ corresponding to each position j in the $i^{th}$ row of the check matrix H, at which the bit is set to "1". Further, each time the multiplexer 111b selects $\psi(q_{i,j})$, the addition circuit 111 adds the selected $\psi(q_{i,j})$ to the intermediate result held by one of the registers 111a (i.e., the intermediate result selected by the multiplexer 111c). Each time this addition is performed, the intermediate result of the register 111a used for the addition is updated to a new intermediate result as the addition result. Assume that later on, $\psi(q_{i,j})$ corresponding to the last position j in the $i^{th}$ row is added to the intermediate result held by the register 111a at this time. As is apparent, the result of this addition indicates the sum of $\psi(q_{i,j})$ values, i.e., the sum of $\psi(q_{i,j})$ values corresponding to all positions j included in M(i).

Assume further that processing of one row of each permuted matrices $I_{g,h}$ in the addition circuit 111, i.e., one addition process, can be performed by one cycle. In this case, the operation of the addition circuit 111 for calculating the sum of $\psi(q_{i,j})$ values can be executed in s (s=5) cycles. Assuming that one cycle is time Tcyc, the sum of $\psi(q_{i,j})$ values can be executed in s Tcyc (=5 Tcyc).

The subtraction circuit 112 comprises multiplexers (MUX) 112a and 112b, and a subtracter 112c. The multiplexer 112a sequentially selects $\psi(q_{i,j})$ corresponding to each position j in the $i^{th}$ row of the check matrix H, at which the bit is set to "1", in cycles following the cycle in which the sum of $\psi(q_{i,j})$ values corresponding to positions j in the $i^{th}$ row of the check matrix H, at which the bit is set to "1", is held by one of the registers 111a. On the other hand, the multiplexer 112b selects the output of the register 111a, i.e., the above-mentioned sum. The subtracter 112c subtracts $\psi(q_{i,j})$ selected by the multiplexer 112a from the sum selected by the multiplexer 112b. As a result, the sum of $\psi(q_{i,j})$ values corresponding to all positions j' that satisfy M(i)\j can be acquired. The subtraction, by the subtracter 112c, of $\psi(q_{i,j})$ from the sum held by the one register 111a is performed concerning $\psi(q_{i,j})$ values corresponding to all positions j in the $i^{th}$ row of the check matrix H, at which the bit is set to "1".

Thus, the subtraction circuit 112 sequentially calculates the sum of $\psi(q_{i,j'})$ values corresponding to all positions j' that satisfy M(i)\j. The calculation of the sum of $\psi(q_{i,j'})$ values corresponding to all positions j' that satisfy M(i)\j, performed concerning each position j in the $i^{th}$ row of the check matrix H, at which the bit is set to "1", can be executed in s (=5) cycles. During the subtraction process by the subtraction circuit 112, the addition circuit 111 can perform the next addition process. At this time, the multiplexer 111c selects the other of the registers 111a (i.e., the register that is not selected by the multiplexer 112b during the subtraction process by the subtraction circuit 112). The content of the other register is updated to the addition result of the adder 111d included in the addition circuit 111. However, the next addition process by the addition circuit 111 is started after the parity-processing unit 20-k acquires new $\psi(q_{i,j})$ corresponding to each new position i in the first to $m^{th}$ rows of the check matrix H, at which the bit is set to "1".

The lookup table 120 is used to convert the subtraction result of the subtracter 112 (i.e., the computation result of the sum computation circuit 110) into an operation value of the $\psi$ function, i.e., $\psi'$ (subtraction result). The lookup table 120 is referred to, using the subtraction result of the subtracter 112. Assume that the subtraction result is x. The entry of the lookup table 120 designated by x prestores $\psi(x)$ unique to x. Accordingly, $\psi(x)$ can be acquired from the lookup table 120 simply by referring to the table 120 using the subtraction result x of the subtracter 112. In the embodiment, the entry of the lookup table 120 designated by x stores $\psi(x)=-\log(\tanh(x/2))$.

The sign computation circuit 130 comprises a pair of registers 131, multiplexers (MUX) 132 and 133, exclusive-OR circuit 134, multiplexers (MUX) 135 and 136, exclusive-OR circuit 137 and multiplexer (MUX) 138. The registers 131 are each a register of, for example, 1 bit used to hold the intermediate result (or final result) of sign computation. When one of the registers 131 holds the final result of sign computation, the other register is used to hold the intermediate result of new sign computation.

The multiplexer 132 sequentially selects an MSB of $q_{i,j}$, i.e., a sign, corresponding to each position j in the $i^{th}$ row of the check matrix H, at which the bit is set to "1". Each MSB of $q_{i,j}$ will be often expressed by MSB($q_{i,j}$). The multiplexer 133 selects the intermediate result (sign) of sign computation so far held by one of the registers 111a. The exclusive-OR circuit 134 acquires the exclusive-OR of the sign selected by the multiplexer 132 and the intermediate result (sign) of sign computation so far. The exclusive-OR result of the exclusive-OR circuit 134 indicates a new intermediate result of sign computation. The intermediate result in the register 131 used for the operation of the exclusive-OR circuit 134 is updated to the exclusive-OR result of the exclusive-OR circuit 134, i.e., the new intermediate result of sign computation.

As described above, the multiplexer 132 sequentially selects MSB($q_{i,j}$) corresponding to each position j in the $i^{th}$ row of the check matrix H, at which the bit is set to "1". Each time the multiplexer 132 selects MSB($q_{i,j}$), the sign computation circuit 130 executes the operation of acquiring the exclusive-OR of the selected MSB($q_{i,j}$) and the intermediate result (sign) of sign computation held by the register 131 at this time. Further, each time exclusive-OR is computed, the intermediate result held by the register 131 and used for the exclusive-OR computation is updated to a new intermediate result as the result of the computation. Assume that later on, the exclusive-OR of MSB($q_{i,j}$) corresponding to the last position j in the $i^{th}$ row and the intermediate result held by the register 131 at this time is computed. As is apparent, the result (final result) of this exclusive-OR computation indicates the product of the signs of $q_{i,j}$ corresponding to all positions j in the $i^{th}$ row at which the bit is set to "1", i.e., the product of the signs of $q_{i,j}$ corresponding to all positions j included in M(i). The above-described operation of the sign computation circuit 130 for computing the exclusive-OR concerning MSB ($q_{i,j}$), namely, the sign computation, is performed in synchronism with the addition process of the addition circuit 111, and can be executed in s (=5) cycles.

The multiplexer 135 sequentially selects MSB($q_{i,j}$) corresponding to each position j in the $i^{th}$ row of the check matrix H, at which the bit is set to "1". The selection operation of the multiplexer 135 is executed in cycles following the cycle in which the exclusive-OR concerning MSB($q_{i,j}$) values corresponding to all positions j included in M(i) (i.e., the final result of the exclusive-OR computation indicating the product) is held by one of the registers 131. On the other hand, the multiplexer 136 selects the output of the register 131, i.e., the above-mentioned exclusive-OR (the final result of the exclusive-OR computation). The exclusive-OR circuit 137 acquires the exclusive-OR of the exclusive-OR selected by the multiplexer 136 and MSB($q_{i,j}$) selected by the multiplexer 135. As a result, the product of the signs of $q_{i,j'}$ values corresponding to all positions j' that satisfy M(i)\j can be acquired. The operation of the exclusive-OR circuit 137 for acquiring the exclusive-OR of the product (held by the one register 131) and MSB($q_{i,j}$) is performed concerning MSB($q_{i,j}$) values corresponding to all positions j in the $i^{th}$ row of the check matrix H, at which the bit is set to "1". Accordingly, concerning each position j in the $i^{th}$ row of the check matrix H, at which the bit is set to "1", the sign computation circuit 130 sequentially computes the product of MSB($q_{i,j}$) values corresponding to all positions j' that satisfy M(i)\j. In accordance with the output of the exclusive-OR circuit 137, the multiplexer 138 selects, as $r_{i,j}$, the output of the lookup table 120 or a value acquired by inverting the sign of this output.

Figure 4:
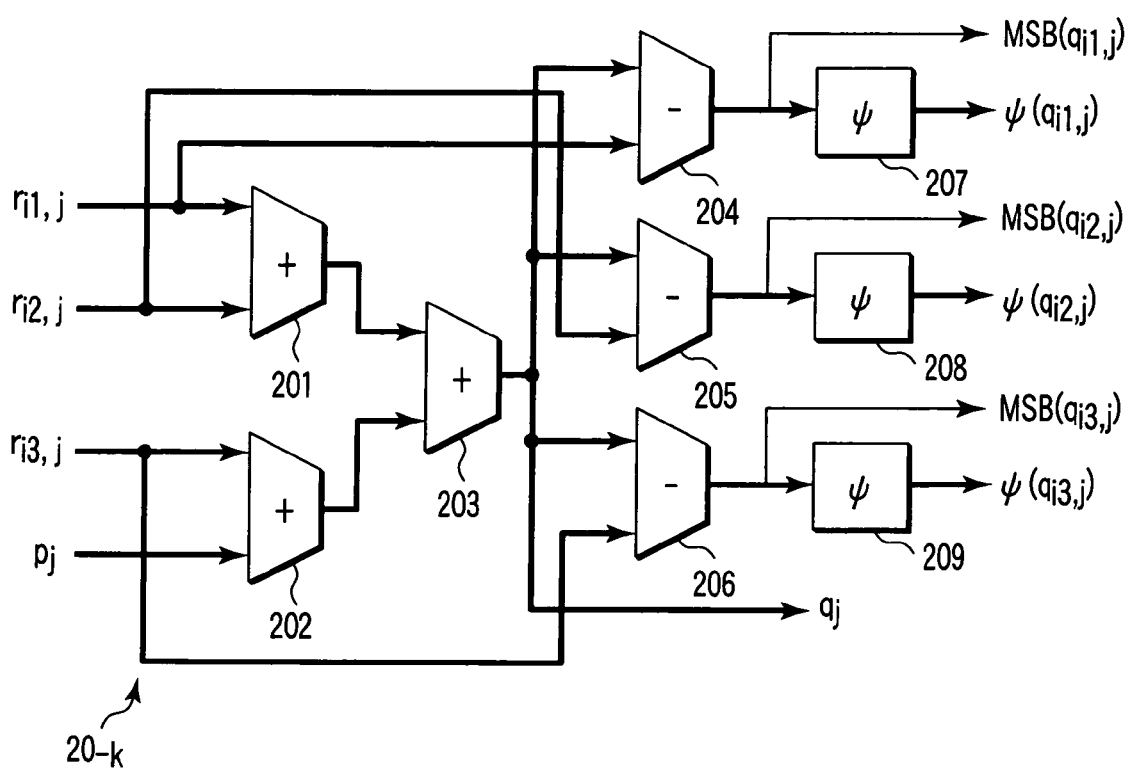
FIG. 4 is a block diagram illustrating the configuration of the parity-processing unit $20\text{-}k$ ($k=1, 2, \ldots, m$) appearing in FIG. 2.

FIG. 4 is a block diagram illustrating the configuration of the parity-processing unit 20-k (k=1, 2, ..., m). The parity-processing unit 20-k is constructed in light of the feature that the number (3 in the embodiment) of "1" bits in each column of the check matrix H is smaller than the number (5 in the embodiment) of "1" bits in each row of the check matrix H. Namely, the parity-processing unit 20-k is configured to simultaneously perform parity update computation on all columns j, using $r_{i,j}$ corresponding to each position (row position) i in the $j^{th}$ column of the check matrix H, at which the bit is set to "1". To this end, the parity-processing unit 20-k comprises three adders 201, 202 and 203, three subtracters 204, 205 and 206, and three lookup tables (LUT) 207, 208 and 209 as shown in FIG. 4.

The adder 201 adds $r_{i1,j}$ to $r_{i2,j}$, and the adder 202 adds $r_{i3,j}$ to $p_j$. $r_{i1,j}$, $r_{i2,j}$ and $r_{i3,j}$ represent bit information items corresponding to bit positions i1, i2 and i3 in the $j^{th}$ column (column j) of the check matrix H, at which the bit is set to "1". Assume here that the $j^{th}$ column of the check matrix H is positioned in three permuted matrices $I_{1,h}$, $I_{2,h}$ and $I_{3,h}$ (of the $h^{th}$ column block). In this case, each of the permuted matrices $I_{1,h}$, $I_{2,h}$ and $I_{3,h}$ contains one position in the $j^{th}$ column, at which the bit is set to "1". Namely, $r_{i1,j}$, $r_{i2,j}$ and $r_{i3,j}$ represent bit information items corresponding to bit positions in the permuted matrices $I_{1,h}$, $I_{2,h}$ and $I_{3,h}$ and in the $j^{th}$ column of the check matrix H, at which the bit is set to "1". The bit positions i1, i2 and i3 in the $j^{th}$ column of the check matrix H, at which the bit is set to "1", can be uniquely determined in units of rows. Accordingly, $r_{i1,j}$, $r_{i2,j}$ and $r_{i3,j}$ corresponding to the bit positions i1, i2 and i3 in the $j^{th}$ column, at which the bit is set to "1", can be uniquely determined.

The adder 203 adds up the addition results of the adders 201 and 202. Namely, the adder 203 sums up $p_j$ and the total of $r_{i1,j}$, $r_{i2,j}$ and $r_{i3,j}$. Thus, the adders 201 to 203 provide an addition circuit for summing up $p_j$ and the total of $r_{i1,j}$, $r_{i2,j}$ and $r_{i3,j}$. The addition result of the adder 203 indicates the probability $q_j$ of bit $x_j$ in the LDPC code being 1 or 0, which is estimated at the present stage.

The subtracter 204 subtracts $r_{i1,j}$ from the addition result of the adder 203. The subtraction result of the subtracter 204 indicates updated parity information $q_{i1,j}$. The subtracter 205 subtracts $r_{i2,j}$ from the addition result of the adder 203. The subtraction result of the subtracter 205 indicates updated parity information $q_{i2,j}$. The subtracter 206 subtracts $r_{i3,j}$ from the addition result of the adder 203. The subtraction result of the subtracter 206 indicates updated parity information $q_{i3,j}$. In other words, in each parity-processing unit 20-k, three $q_{i1,j}$, $q_{i2,j}$ and $q_{i3,j}$ corresponding to "1" bits in the $j^{th}$ column (j=k, m+k, 2m+k, 3m+k, 4m+k) of the check matrix H can be simultaneously acquired. As a result, MSB($q_{i1,j}$), MSB($q_{i2,j}$) and MSB($q_{i3,j}$) can be acquired. Further, $\psi(q_{i1,j})$, $\psi(q_{i2,j})$ and $\psi(q_{i3,j})$ can also be simultaneously acquired by simultaneously referring to the lookup tables 207, 208 and 209 using $q_{i1,j}$, $q_{i2,j}$ and $q_{i3,j}$ as the subtraction results of the subtracters 204, 205 and 206. $\psi(q_{i1,j})$, $\psi(q_{i2,j})$ and $\psi(q_{i3,j})$ are used as $\psi(q_{i,j})$ for bit update computation in each bit-processing unit 10-i.

As described above, one feature of the embodiment lies in that the lookup tables 207, 208 and 209 are provided at the output side of each parity-processing unit 20-k. Instead of providing the lookup tables 207, 208 and 209 at the output side of each parity-processing unit 20-k, respective lookup tables can be provided at the output side of the multiplexers 132 and 135 in each bit-processing unit 10-i. In this case, however, three lookup tables are necessary for each bit-processing unit (i.e., for processing each row), although no lookup table is necessary for each parity-processing unit. Accordingly, the LDPC-code decoder requires (3×rm=9m) lookup tables in total. In contrast, in the embodiment, one lookup table is necessary for each bit-processing unit 10-i, and r lookup tables are necessary for each parity-processing unit 20-k. That is, the LDPC-code decoder requires only 6m (=2rm=(1×rm) +(r×m)) lookup tables in total. Thus, in the LDPC-code decoder of the embodiment in which lookup tables are provided at the output side of each parity-processing unit 20-k, the number of required lookup tables can be reduced from 9m to 6m.

Figure 6:
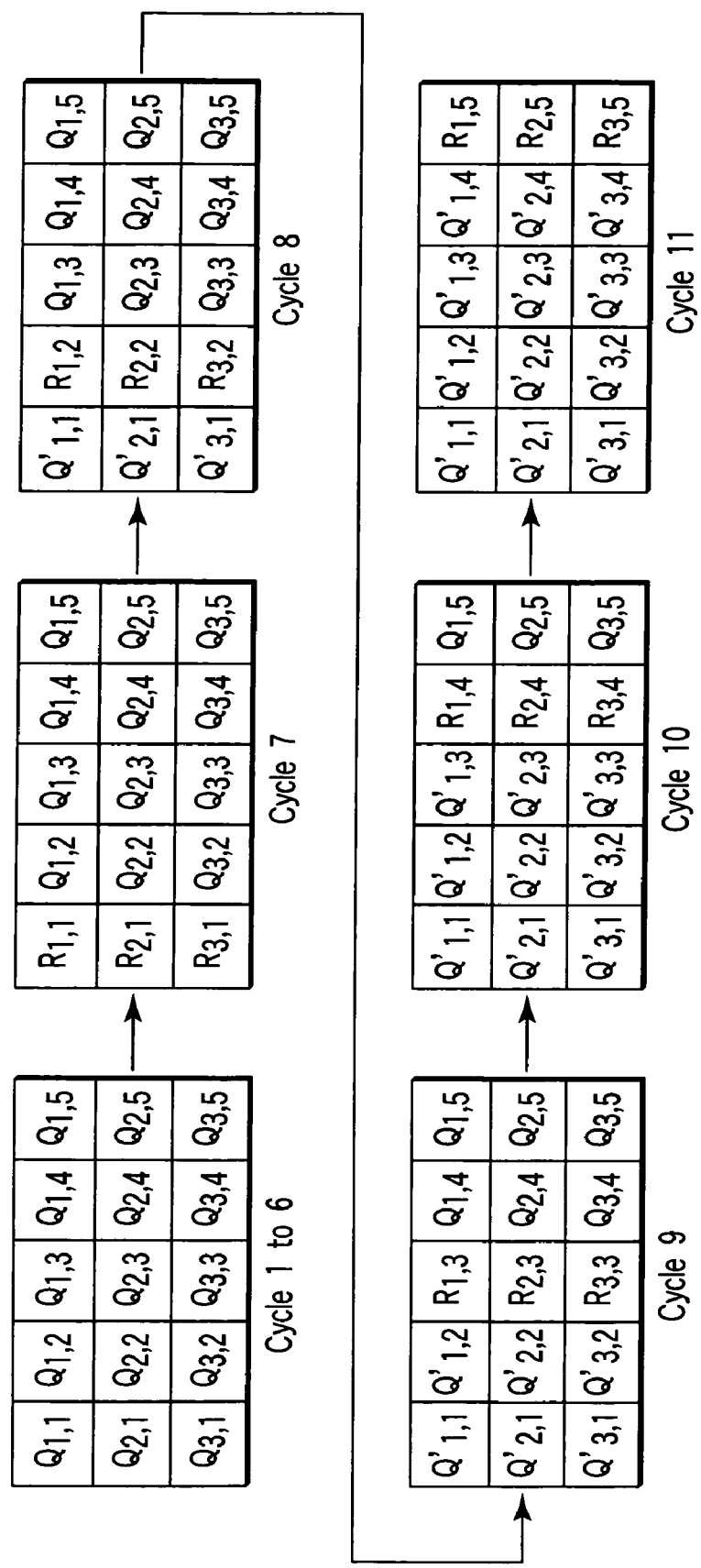
FIG. 6 is a view illustrating changes in the states of the areas of a memory 30 corresponding to respective (3×5 (r×s)) permuted matrices that provide a check matrix H.

Referring then to FIGS. 5 and 6, a description will be given of the flow of computation performed in the bit-processing units 10-1 to 10-M and parity-processing units 20-1 to 20-m. The bit-processing units 10-1 to 10-M and parity-processing units 20-1 to 20-m are controlled by the controller 40 incorporated in the LDPC-code decoder shown in FIG. 2. FIG. 5 shows input/output information in each cycle during bit update computation by the bit-processing units 10-1 to 10-M and parity update computation by the parity-processing units 20-1 to 20-m. The bit update computation and parity update computation may hereinafter be referred to as "horizontal calculation HCALC" and "vertical calculation VCALC", respectively. FIG. 6 shows changes in the states of regions that are included in the memory 30 and correspond to the (r×s=15) permuted matrices of the check matrix H. In FIGS.

5 and 6, a set of ψ($q_{i,j}$) values and a set of $r_{i,j}$ values are represented by $Q_{g,h}$ and $R_{g,h}$, respectively. $Q_{g,h}$ includes MSB ($q_{i,j}$).

<Initialization>

Firstly, the controller 40 executes an initialization process. In the initialization process, the controller 40 stores ψ($p_j$) and sgn($p_j$) into each memory unit of the memory 30. $p_j$ represents a logarithmic value of probability acquired from the output of the communication channel. Concerning all j values, ψ($p_j$) is set as the initial value of each of ψ($q_{i1,j}$), ψ($q_{i2,j}$) and ψ($q_{i3,j}$). $q_{i1,j}$, $q_{i2,j}$ and $q_{i3,j}$ represent parity information items $q_{i,j}$ (i=i1, i2, i3) corresponding to bit positions i1, i2 and i3 in the $j^{th}$ column of the check matrix H, at which the bit is set to "1". Further, in the initialization process, sgn($p_j$) is set as the initial value of each of MSB($q_{i1,j}$), MSB($q_{i2,j}$) and MSB($q_{i3,j}$). The controller 40 also resets the registers 31 and 111a incorporated in each of the M bit-processing units 10-1 to 10-M.

<First Cycle>

In the first cycle, the M bit-processing units 10-1 to 10-M start addition processing. Specifically, MSB($q_{i,j1}$) and ψ($q_{i,j1}$) are stored into the registers 131 and 111a of each of the bit-processing units 10-1 to 10-M, respectively. $q_{i,j1}$ represents parity information $q_{i,j}$ (j=j1) corresponding to bit positions j1 included in the bit positions j1 to j5 of the $i^{th}$ row of the check matrix H at which the bit is set to "1". Namely, MSB ($q_{i,j1}$) and ψ($q_{i,j1}$) stored in the registers 131 and 111a of each of the bit-processing units 10-1 to 10-M, respectively, correspond to the leftmost position j1 (the first bit position) of the bit positions ji to j5 in each ($i^{th}$) row of the check matrix H at which the bit is set to "1", and correspond to $Q_{1,1}$, $Q_{2,1}$ and $Q_{3,1}$ stored in the memory 30. The first bit position ji belongs to the first column block.

<Second Cycle>

In the second cycle, the multiplexer 111b in the addition circuit 111 of each of the bit-processing units 10-1 to 10-M selects ψ($q_{i,j2}$). The addition circuit 111 performs addition processing, using ψ($q_{i,j2}$). Specifically, the adder 111d of the addition circuit 111 adds up the value stored in the register 111a in the first cycle, and ψ($q_{i,j2}$) selected by the multiplexer 111b. The addition result of the adder 111d, i.e., the sum of the value (ψ($q_{i,j1}$)) stored in the register 111a and ψ($q_{i,j2}$), is stored into the register 111a. On the other hand, the sign computation circuit 130 of each of the bit-processing units 10-1 to 10-M selects MSB($q_{i,j2}$), using the multiplexer 132. In the second cycle, using MSB($q_{i,j2}$), the exclusive-OR circuit 134 of the sign computation circuit 130 executes exclusive-OR computation. Namely, the exclusive-OR circuit 134 calculates the exclusive-OR of the value (MSB($q_{i,j1}$)) stored in the register 131 in the first cycle, and MSB($q_{i,j2}$) selected by the multiplexer 132. The computation result of the exclusive-OR circuit 134, i.e., the exclusive-OR of the value stored in the register 131 and MSB($q_{i,j2}$), is stored in the register 131. MSB($q_{i,j2}$) and ψ($q_{i,j2}$) correspond to the second bit position j2 (j=j2) included in the bit positions j1 to j5 in each ($i^{th}$) row of the check matrix H at which the bit is set to "1", and correspond to $Q_{1,2}$, $Q_{2,2}$ and $Q_{3,2}$ stored in the memory 30. The second bit position j2 belongs to the second column block.

<Third Cycle>

In the third cycle, the multiplexer 111b in the addition circuit 111 of each of the bit-processing units 10-1 to 10-M selects ψ($q_{i,j3}$). The addition circuit 111 performs addition processing, using ψ($q_{i,j3}$). Specifically, the adder 111d of the addition circuit 111 adds up the value stored in the register 111a in the second cycle, and ψ($q_{i,j3}$) selected by the multiplexer 111b. The addition result of the adder 111d, i.e., the sum of the value stored in the register 111a and ψ($q_{i,j3}$), is stored into the register 111a. On the other hand, the sign computation circuit 130 of each of the bit-processing units 10-1 to 10-M selects MSB($q_{i,j3}$), using the multiplexer 132. In the third cycle, using MSB($q_{i,j3}$), the exclusive-OR circuit 134 of the sign computation circuit 130 executes exclusive-OR computation. Namely, the exclusive-OR circuit 134 calculates the exclusive-OR of the value stored in the register 131 in the second cycle, and MSB($q_{i,j3}$) selected by the multiplexer 132. The computation result of the exclusive-OR circuit 134, i.e., the exclusive-OR of the value stored in the register 131 and MSB($q_{i,j3}$), is stored in the register 131. MSB($q_{i,j3}$) and ψ($q_{i,j3}$) correspond to the third bit position j3 (j=j3) included in the bit positions j1 to j5 in each ($i^{th}$) row of the check matrix H at which the bit is set to "1", and correspond to $Q_{1,3}$, $Q_{2,3}$ and $Q_{3,3}$ stored in the memory 30. The third bit position j3 belongs to the third column block.

<Fourth Cycle>

In the fourth cycle, the multiplexer 111b in the addition circuit 111 of each of the bit-processing units 10-1 to 10-M selects ψ($q_{i,j4}$). The addition circuit 111 performs addition processing, using ψ($q_{i,j4}$). Specifically, the adder 111d of the addition circuit 111 adds up the value stored in the register 111a in the third cycle, and ψ($q_{i,j\_4}$) selected by the multiplexer 111b. The addition result of the adder 111d, i.e., the sum of the value stored in the register 111a and ψ($q_{i,j4}$), is stored into the register 111a. On the other hand, the sign computation circuit 130 of each of the bit-processing units 10-1 to 10-M selects MSB($q_{i,j4}$), using the multiplexer 132. In the fourth cycle, using MSB($q_{i,j4}$), the exclusive-OR circuit 134 of the sign computation circuit 130 executes exclusive-OR computation. Namely, the exclusive-OR circuit 134 calculates the exclusive-OR of the value stored in the register 131 in the third cycle, and MSB($q_{i,j4}$) selected by the multiplexer 132. The computation result of the exclusive-OR circuit 134, i.e., the exclusive-OR of the value stored in the register 131 and MSB($q_{i,j4}$), is stored in the register 131. MSB($q_{i,j4}$) and ($q_{i,j4}$) correspond to the fourth bit position j4 (j=j4) included in the bit positions j1 to j5 in each ($i^{th}$) row of the check matrix H at which the bit is set to "1", and correspond to $Q_{1,4}$, $Q_{2,4}$ and $Q_{3,4}$ stored in the memory 30. The fourth bit position j4 belongs to the fourth column block.

<Fifth Cycle>

In the fifth cycle, the multiplexer 111b in the addition circuit 111 of each of the bit-processing units 10-1 to 10-M selects *($q_{i,j5}$). The addition circuit 111 performs addition processing, using ψ($q_{i,j5}$). Specifically, the adder 111d of the addition circuit 111 adds up the value stored in the register 111a in the fourth cycle, and ψ($q_{i,j5}$) selected by the multiplexer 111b. The addition result of the adder 111d, i.e., the sum of the value stored in the register 111a and ψ($q_{i,j5}$), is stored into the register 111a. On the other hand, the sign computation circuit 130 of each of the bit-processing units 10-1 to 10-M selects MSB($q_{i,j5}$), using the multiplexer 132. In the fifth cycle, using MSB($q_{i,j5}$), the exclusive-OR circuit 134 of the sign computation circuit 130 executes exclusive-OR computation. Namely, the exclusive-OR circuit 134 calculates the exclusive-OR of the value stored in the register 131 in the fourth cycle, and MSB($q_{i,j5}$) selected by the multiplexer 132. The computation result of the exclusive-OR circuit 134, i.e., the exclusive-OR of the value stored in the register 131 and MSB($q_{i,j5}$), is stored in the register 131. MSB($q_{i,j5}$) and ψ($q_{i,j5}$) correspond to the fifth bit position j5 (j=j5) included in the bit positions j1 to j5 in each ($i^{th}$) row of the check matrix H at which the bit is set to "1", and correspond to $Q_{1,5}$, $Q_{2,5}$ and $Q_{3,5}$ stored in the memory 30. The fifth bit position j5 belongs to the fifth column block.

<Sixth Cycle>

In the sixth cycle, the subtraction circuit 112 of each of the bit-processing units 10-1 to 10-M starts a subtraction process. The subtraction process utilizes the final result of the addition process held in one of the registers 111a in each bit-processing unit 10-i (i=1, 2, . . . , M), and $Q_{1,1}$, $Q_{2,1}$ and $Q_{3,1}$ stored in the memory 30. The final result means the sum of $\psi(q_{i,j})$ values corresponding to positions in the $i^{th}$ row of the check matrix H, at which the bit is set to "1". In the subtraction process, $\psi(q_{i,j1})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j1})$. After that, the subtracter 112c of the subtraction circuit 112 subtracts $\psi(q_{i,j1})$ selected by the multiplexer 112a from the final result of the addition process selected by the multiplexer 112b.

On the other hand, the sign computation circuit 130 of each of the bit-processing units 10-1 to 10-M excludes $MSB(q_{i,j1})$ from the final result of the exclusive-OR computation. To this end, the multiplexer 136 in the sign computation circuit 130 selects the one of the registers 131 that holds the final result of the exclusive-OR computation. The final result of the exclusive-OR computation means the exclusive-ORs of $MSB(q_{i,j})$ values corresponding to positions j in the $i^{th}$ row of the check matrix H, at which the bit is set to "1". Further, the multiplexer 135 in the sign computation circuit 130 selects $MSB(q_{i,j1})$. After that, the exclusive-OR circuit 137 of the sign computation circuit 130 acquires the exclusive-OR of the final result of the exclusive-OR computation selected by the multiplexer 136 and $MSB(q_{i,j1})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the sixth cycle, $R_{1,1}$, $R_{2,1}$ and $R_{3,1}$ are generated and stored in the memory 30. $R_{1,1}$, $R_{2,1}$ and $R_{3,1}$ represent a set of $r_{i,j}$ values corresponding to the bit positions in the permuted matrices $I_{1,1}$, $I_{2,1}$ and $I_{3,1}$, which correspond to the $1^{st}$ to $m^{th}$ columns (of the first column block) included in the check matrix H, and at which the bit is set to "1".

<Seventh Cycle>

In the seventh cycle, the subtraction circuit 112 of each of the bit-processing units 10-1 to 10-M starts a subtraction process. The subtraction process utilizes the final result of the addition process held in one of the registers 111a in each bit-processing unit 10-i (i=1, 2, . . . , M), and $Q_{1,2}$, $Q_{2,2}$ and $Q_{3,2}$ stored in the memory 30. The final result means the sum of $\psi(q_{i,j})$ values corresponding to positions in the $i^{th}$ row of the check matrix H, at which the bit is set to "1". In the subtraction process, $\psi(q_{i,j2})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j2})$. After that, the subtracter 112c of the subtraction circuit 112 subtracts $\psi(q_{i,j2})$ selected by the multiplexer 112a from the final result of the addition process selected by the multiplexer 112b.

On the other hand, the sign computation circuit 130 of each of the bit-processing units 10-1 to 10-M excludes $MSB(q_{i,j2})$ from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects $MSB(q_{i,j2})$. After that, the exclusive-OR circuit 137 of the sign computation circuit 130 acquires the exclusive-OR of the final result of the exclusive-OR computation selected by the multiplexer 136 and $MSB(q_{i,j2})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the seventh cycle, $R_{1,2}$, $R_{2,2}$ and $R_{3,2}$ are generated and stored in the memory 30. $R_{1,2}$, $R_{2,2}$ and $R_{3,2}$ represent a set of $r_{i,j}$ values corresponding to the bit positions in the permuted matrices $I_{1,2}$, $I_{2,2}$ and $I_{3,2}$, which correspond to the $(m+1)^{th}$ to $2m^{th}$ columns (of the second column block) included in the check matrix H, and at which the bit is set to "1".

In the seventh cycle, each element $r_{i,j}$ in $R_{1,2}$, $R_{2,2}$ and $R_{3,2}$ stored in the memory 30 can be utilized. Accordingly, in the seventh cycle, the parity-processing units 20-1 to 20-m start parity update computation under the control of the controller 40, utilizing each element $r_{i,j}$ in $R_{1,2}$, $R_{2,2}$ and $R_{3,2}$. As a result, concerning each of the $1^{st}$ to $m^{th}$ columns (of the first column block) included in the check matrix H, $\psi(q_{i,j1})$, $\psi(q_{i,j2})$ and $\psi(q_{i,j3})$, $MSB(q_{i,j1})$, $MSB(q_{i,j2})$ and $MSB(q_{i,j3})$, and $q_j$ are acquired. Using $\psi(q_{i,j1})$, $\psi(q_{i,j2})$ and $\psi(q_{i,j3})$, $MSB(q_{i,j1})$, $MSB(q_{i,j2})$ and $MSB(q_{i,j3})$, and $q_j$ acquired concerning each of the $1^{st}$ to $m^{th}$ columns of the check matrix H, $Q_{1,1}$, $Q_{2,1}$ and $Q_{3,1}$ stored in the memory 30 are updated to $Q'_{1,1}$, $Q'_{2,1}$ and $Q'_{3,1}$.

Thus, in the embodiment, parity update computation can be started before bit update computation corresponding to all bits in each of the $1^{st}$ to $M^{th}$ rows of the check matrix H is finished. Namely, in the embodiment, parity update computation can be started when only bit update computation is finished which corresponds to each bit position in the permuted matrices $I_{1,1}$, $I_{2,1}$ and $I_{3,1}$ (of the first column block) included in the check matrix H, at which the bit is set to "1". In other words, in the embodiment, bit update computation and parity update computation can be processed using a pipeline.

<Eighth Cycle>

In the eighth cycle, each element $q_{i,j}$ in updated $Q'_{1,2}$, $Q'_{2,2}$ and $Q'_{3,2}$ can be utilized. Accordingly, in the eighth cycle, the bit-processing units 10-1 to 10-M start next bit update computation under the control of the controller 40, thereby performing the same addition process as in the first cycle. However, the result of the addition process is held by the register 111a other than the register 111a used to hold the result of the addition process of the first cycle (the first to fifth cycles).

Thus, in the embodiment, bit update computation can be started before parity update computation corresponding to all bits in each of the $1^{st}$ to $N^{th}$ columns of the check matrix H is finished. Namely, in the embodiment, next bit update computation can be started when only parity update computation is finished which corresponds to each bit position in the permuted matrices $I_{1,1}$, $I_{2,1}$ and $I_{3,1}$ (of the first column block) included in the check matrix H (i.e., when parity update computation has been performed concerning the first m columns of the check matrix H). In other words, the combination of bit update computation and parity update computation can be iterated using a pipeline.

Further, in the eighth cycle, a subtraction process by the bit-processing units 10-1 to 10-M is executed in parallel with the above addition process. In the subtraction process, the final result of the addition process held by the one of the register 111a in each of the bit-processing unit 10-1 to 10-M, and $Q_{1,3}$, $Q_{2,3}$ and $Q_{3,3}$ stored in the memory 30 are used. The final result of the addition process means the sum of $\psi(q_{i,j})$ values corresponding to positions in the $i^{th}$ row of the check matrix H, at which the bit is set to "1". In the subtraction process, $\psi(q_{i,j3})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j3})$. After that, the subtracter 112c of the subtraction circuit 112 subtracts $\psi(q_{i,j3})$ selected by the multiplexer 112a from the final result of the addition process selected by the multiplexer 112b.

On the other hand, the sign computation circuit 130 of each of the bit-processing units 10-1 to 10-M excludes $MSB(q_{i,j3})$ from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects $MSB(q_{i,j3})$. After that, the exclusive-OR circuit 137 of the sign computation circuit 130 acquires the exclusive-OR of the final result of the exclusive-OR computation selected by the multiplexer 136 and $MSB(q_{i,j3})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the eighth cycle, $R_{1,3}$, $R_{2,3}$ and $R_{3,3}$ are generated and stored in the memory 30. $R_{1,3}$, $R_{2,3}$ and $R_{3,3}$ represent a set of $r_{i,j}$ values corresponding to the bit positions in the permuted matrices $I_{1,3}$, $I_{2,3}$ and $I_{3,3}$, which correspond to the $(2m+1)^{th}$ to $3m^{th}$ columns (of the third column block) included in the check matrix H, and at which the bit is set to "1".

Furthermore, in the eighth cycle, the parity-processing units 20-1 to 20-$m$ perform parity update computation, utilizing each element $r_{i,j}$ in $R_{1,2}$, $R_{2,2}$ and $R_{3,2}$ stored in the memory 30 in the seventh cycle. As a result, $Q_{1,2}$, $Q_{2,2}$ and $Q_{3,2}$ stored in the memory 30 are updated to $Q'_{1,2}$, $Q'_{2,2}$ and $Q'_{3,2}$.

<Ninth Cycle>

In the ninth cycle, the bit-processing units 10-1 to 10-M perform the same addition process as in the second cycle, using $Q'_{1,2}$, $Q'_{2,2}$ and $Q'_{3,2}$. Further, in the ninth cycle, the bit-processing units 10-1 to 10-M perform a subtraction process in parallel with the addition process. In the subtraction process, the final result of the addition process held by the one of the register 111a in each bit-processing unit 10-$i$ ($i=1$, 2, . . . , M), and $Q_{1,4}$, $Q_{2,4}$ and $Q_{3,4}$ stored in the memory 30 are used. The final result of the addition process means the sum of $\psi(q_{i,j})$ values corresponding to positions in the $i^{th}$ row of the check matrix H, at which the bit is set to "1". In the subtraction process, $\psi(q_{i,j4})$ is subtracted from the final result of the addition-process. To this end, the multiplexer 112b of the subtraction circuit 112 selects the one of the registers 111a that holds the final result of the addition process. The multiplexer 112a of the subtraction circuit 112 selects $\psi(q_{i,j4})$. After that, the subtracter 112c of the subtraction circuit 112 subtracts $\psi(q_{i,j4})$ selected by the multiplexer 112a from the final result of the addition process selected by the multiplexer 112b.

On the other hand, the sign computation circuit 130 of each of the bit-processing units 10-1 to 10-M excludes $MSB(q_{i,j4})$ from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects $MSB(q_{i,j4})$. After that, the exclusive-OR circuit 137 of the sign computation circuit 130 acquires the exclusive-OR of the final result of the exclusive-OR computation selected by the multiplexer 136 and $MSB(q_{i,j4})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the ninth cycle, $R_{1,4}$, $R_{2,4}$ and $R_{3,4}$ are generated and stored in the memory 30. $R_{1,4}$, $R_{2,4}$ and $R_{3,4}$ represent a set of $r_{i,j}$ values corresponding to the bit positions in the permuted matrices $I_{1,4}$, $I_{2,4}$ and $I_{3,4}$, which correspond to the $(3m+1)^{th}$ to $4m^{th}$ columns (of the fourth column block) included in the check matrix H, and at which the bit is set to "1".

Furthermore, in the ninth cycle, the parity-processing units 20-1 to 20-$m$ perform parity update computation, utilizing each element $r_{i,j}$ in $R_{1,3}$, $R_{2,3}$ and $R_{3,3}$ stored in the memory 30 in the eighth cycle. As a result, $Q_{1,3}$, $Q_{2,3}$ and $Q_{3,3}$ stored in the memory 30 are updated to $Q'_{1,3}$, $Q'_{2,3}$ and $Q'_{3,3}$.

<Tenth Cycle>

In the tenth cycle, the bit-processing units 10-1 to 10-M perform the same addition process as in the third cycle, using $Q'_{1,3}$, $Q'_{2,3}$ and $Q'_{3,3}$. Further, in the tenth cycle, the bit-processing units 10-1 to 10-M perform a subtraction process in parallel with the addition process. In the subtraction process, the final result of the addition process held by the one of the register 111a in each bit-processing unit 10-$i$ ($i=1$, 2, . . . , M), and $Q_{1,5}$, $Q_{2,5}$ and $Q_{3,5}$ stored in the memory 30 are used. The final result of the addition process means the sum of $\psi(q_{i,j})$ values corresponding to positions in the $i^{th}$ row of the check matrix H, at which the bit is set to "1". In the subtraction process, $\psi(q_{i,j5})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j5})$. After that, the subtracter 112c of the subtraction circuit 112 subtracts $\psi(q_{i,j5})$ selected by the multiplexer 112a from the final result of the addition process selected by the multiplexer 112b.

On the other hand, the sign computation circuit 130 of each of the bit-processing units 10-1 to 10-M excludes $MSB(q_{i,j5})$ from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects $MSB(q_{i,j5})$. After that, the exclusive-OR circuit 137 of the sign computation circuit 130 acquires the exclusive-OR of the final result of the exclusive-OR computation selected by the multiplexer 136 and $MSB(q_{i,j5})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the tenth cycle, $R_{1,5}$, $R_{2,5}$ and $R_{3,5}$ are generated and stored in the memory 30. $R_{1,5}$, $R_{2,5}$ and $R_{3,5}$ represent a set of $r_{i,j}$ values corresponding to the bit positions in the permuted matrices $I_{1,5}$, $I_{2,5}$ and $I_{3,5}$, which correspond to the $(4m+1)^{th}$ to $5m^{th}$ ($N^{th}$) columns (of the fifth column block) included in the check matrix H, and at which the bit is set to "1".

Thus, in the embodiment, bit update computation corresponding to each of the first to $M^{th}$ rows of the check matrix H can be executed in 10 (=2×s) cycles.

Furthermore, in the tenth cycle, the parity-processing units 20-1 to 20-*m* perform parity update computation, utilizing each element $r_{i,j}$ in $R_{1,4}$, $R_{2,4}$ and $R_{3,4}$ stored in the memory 30 in the ninth cycle. As a result, $Q_{1,4}$, $Q_{2,4}$ and $Q_{3,4}$ stored in the memory 30 are updated to $Q'_{1,4}$, $Q'_{2,4}$ and $Q'_{3,4}$.

<Eleventh Cycle>

In the eleventh cycle, the bit-processing units 10-1 to 10-M perform the same addition process as in the fourth cycle, using $Q'_{1,4}$, $Q'_{2,4}$ and $Q'_{3,4}$.

Further, in the eleventh cycle, the parity-processing units 20-1 to 20-*m* perform parity update computation using each element $r_{i,j}$ in $R_{1,5}$, $R_{2,5}$ and $R_{3,5}$ stored in the memory 30 in the tenth cycle. As a result, $Q_{1,5}$, $Q_{2,5}$ and $Q_{3,5}$ stored in the memory 30 are updated to $Q'_{1,5}$, $Q'_{2,5}$ and $Q'_{3,5}$, which is the completion of the first iteration operation including bit update computation and parity update computation. However, bit update computation included in the second iteration operation is already started in the eighth cycle (i.e., in the cycle following the cycle in which parity update computation of the preceding (first) iteration operation is started).

Figure 7:
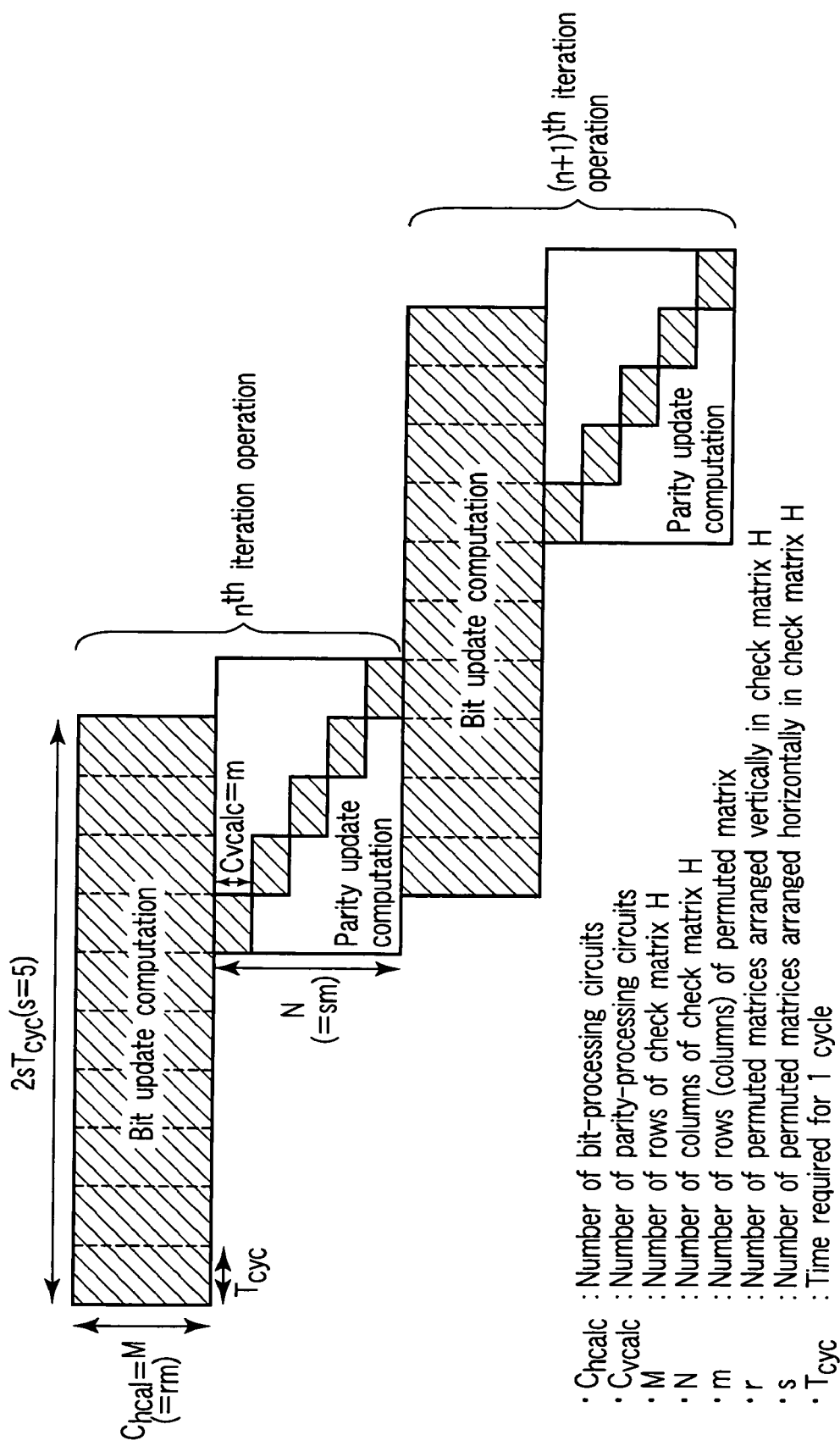
FIG. 7 is a view useful in explaining a schedule for decoding an LDPC code employed in the embodiment.

In the twelfth cycle, et seq., the same operations as those performed in the fifth cycle, et seq., are performed. FIG. 7 orderly shows the above-described schedule for decoding an LDPC code by the LDPC-code decoder. Note that the iteration operation of bit update computation and parity update computation is performed until a hard decision value, which is determined based on r (=3) $q_j$ values corresponding to each of all columns k (j=1, 2, ..., N) of the check matrix H, satisfies the $j^{th}$ parity-check equation. However, if at least one column that does not satisfy the parity-check equation exists even after the iteration operation is performed a predetermined number of times, it is determined that decoding of the LDPC code has failed, whereby the decoding operation is forcibly terminated.

In the above-described embodiment, each parity-processing unit 20-*k* is configured to simultaneously perform parity update computation concerning all positions ($i^{th}$ row position) in the $j^{th}$ column of the check matrix H, using corresponding $r_{i,j}$. However, a parity-processing unit that has the same structure as each bit-processing unit 10-*i* may be employed instead of each parity-processing unit 20-*k*. Namely, parity information $q_{i,j}$ corresponding to the $i^{th}$ row position in the $j^{th}$ column of the check matrix H can be sequentially updated by an addition process and subtraction process in two cycles. In this case, it is sufficient if only a single lookup table is provided at the output side of the parity-processing unit. However, the number of cycles necessary for parity update computation is double the number of cycles in the case of using the parity-processing unit 20-*k*. Further, the start time of bit update computation is delayed by one cycle. In addition, in the above embodiment, the check matrix H is formed of (3×5) permuted matrices. However, the arrangement of the permuted matrices in the check matrix H is not limited to the above. It is sufficient if the check matrix H is formed of (r×s) permuted matrices, assuming that r<s.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A low-density parity-check code decoder comprising:
(r×m) bit-processing units configured to perform bit update computation for sequentially updating bit information corresponding to column positions included in the respective rows of a parity-check matrix, the parity-check matrix being formed of (r×s) permuted matrices each having an array of (m×m) and being divided into s column blocks, a bit at each of the column positions being set to "1";
m parity-processing units configured to perform parity update computation for updating parity information corresponding to row positions in m columns of each column block of the parity-check matrix, a bit at each of the row positions being set to "1"; and
a controller configured to cause, whenever the (r×m) bit-processing units have finished bit update computation for m column positions in the respective rows of the parity-check matrix, the m parity-processing units to perform parity update computation corresponding to m columns of one of the s column blocks to which the m column positions belong, the controller being configured to cause, after the parity-processing units finish parity update computation for m columns of a first one of the s column blocks, the (r×m) bit-processing units to start next bit update computation.

2. The low-density parity-check code decoder according to claim 1, wherein:
an array (r×s) of the (r×s) permuted matrices of the parity-check matrix satisfies a condition that r is smaller than s; and
each of the m parity-processing units simultaneously receives bit information corresponding to r row positions in a corresponding one of the m columns of each of the s column blocks, a bit at each of the r row positions being set to "1", and updates parity information corresponding to the r row positions, based on the bit information corresponding to the r row positions.

3. A low-density parity-check code decoder comprising:
(r×m) bit-processing units configured to perform bit update computation for Sequentially updating bit information corresponding to column positions included in the respective rows of a parity-check matrix, the parity-check matrix being formed of (r×s) permuted matrices each having an array of (m×m) and being divided into s column blocks, a bit at each of the column positions being set to "1", each of the (r×m) bit-processing units including an addition circuit and a subtraction circuit, the addition circuit being configured to perform an addition process for sequentially adding up parity information values corresponding to column positions in one of the rows of the parity-check matrix, thereby acquiring a sum of the parity information values, a bit at each of the column positions being set to "1", a subtraction circuit being configured to sequentially perform subtractions for subtracting, from the sum calculated by the addition circuit, the respective parity information values used for the addition process;
m parity-processing units configured to perform parity update computation for updating parity information corresponding to row positions in m columns of each column block of the parity-check matrix, a bit at each of the row positions being set to "1"; and a controller configured to cause, whenever the (r×m) bit-processing units have finished bit update computation for m column positions in the respective rows of the parity-check matrix, the m parity-processing units to perform parity update computation corresponding to m columns of one of the s column blocks to which the m column positions belong, the controller being configured to cause, after the parity-processing units finish parity update computation for m columns of a first one of the s column blocks, the (r×m) bit-processing units to start next bit update computation.

4. The low-density parity-check code decoder according to claim 3, wherein:

the addition circuit included in each of the (r×m) bit-processing units includes:
- a first multiplexer which sequentially selects parity information values corresponding to column positions in a corresponding one of the rows of the parity-check matrix, a bit at each of the column positions being set to "1"; and
- an adder which calculates a sum of parity information values sequentially selected by the first multiplexer, and the subtraction circuit included in each of the (r×m) bit-processing units includes:
- a second multiplexer which sequentially selects parity information values corresponding to column positions in a corresponding one of the rows of the parity-check matrix, a bit at each of the column positions being set to "1"; and
- a subtracter which subtracts, from the sum calculated by the adder, a parity information value selected by the second multiplexer.

5. The low-density parity-check code decoder according to claim 3, wherein:

each of the (r×m) bit-processing units further includes a sign computation circuit configured to compute, when bit information corresponding to each column position in one of the rows of the parity-check matrix corresponding to said each bit-processing unit is updated by said each bit-processing unit, a product of signs of parity information values corresponding to all column positions in the one row of the parity-check matrix other than said each column position, bits at said each column position and said all column positions being set to "1"; and the sign of the bit information updated by said each bit-processing unit is determined from the product of the signs of the parity information values computed by the sign computation circuit included in said each bit-processing unit.

6. The low-density parity-check code decoder according to claim 3, wherein each of the (r×m) bit-processing units further includes:
- a first multiplexer which sequentially selects most significant bits of parity information Values corresponding to column positions in a corresponding one of the rows of the parity-check matrix, a bit at each of the column positions being set to "1";
- a first exclusive-OR circuit which performs exclusive-OR computation for calculating exclusive-Ors of the most significant bits of the parity information values sequentially selected by the first multiplexer;
- a second multiplexer which sequentially selects most significant bits of parity information values corresponding to column positions in a corresponding one of the rows of the parity-check matrix, a bit at each of the column positions being set to "1"; and
- second exclusive-OR circuit which performs exclusive-OR computation on an exclusive-OR Computation result of the first exclusive-OR circuit and a most significant bit selected by the second multiplexer, an exclusive-OR computation result of the second exclusive-OR circuit indicating the product of the signs of parity information values.

7. The low-density parity-check code decoder according to claim 3, wherein whenever the subtraction circuit included in said each bit-processing unit has finished subtractions for m column positions in the rows of the parity-check matrix, the controller causes the m parity-processing units to execute parity update computation corresponding to m columns of one of the s column blocks to which the m column positions belong.

8. The low-density parity-check code decoder according to claim 3, wherein:

said each bit-processing unit includes a first lookup table configured to convert an output of the subtraction circuit into a value of a particular function for computing probability; and each of the m parity-processing units includes a second lookup table provided at an output side thereof and configured to convert an updated parity information value into a value of the particular function.

9. The low-density parity-check code decoder according to claim 3, wherein:

an array (r×s) of the (r×s) permuted matrices of the parity-check matrix satisfies a condition that r is smaller than s; and each of the m parity-processing units simultaneously receives bit information corresponding to r row positions in a corresponding one of the m columns of each of the s column blocks, a bit at each of the r row positions being set to "1", and updates parity information corresponding to the r row positions, based on the bit information corresponding to the r row positions.

10. The low-density parity-check code decoder according to claim 3 wherein:

an array (r×s) of the (r×s) permuted matrices of the parity-check matrix satisfies a condition that r is smaller than s;

each of the m parity-processing units simultaneously receives bit information corresponding to r row positions in a corresponding one of the m columns of each of the s column blocks, a bit at each of the r row positions being set to "1", and updates parity information corresponding to the r row positions, based on the bit information corresponding to the r row positions;

said each bit-processing unit includes a first lookup table configured to convert an output of the subtraction circuit into a value of a particular function for computing probability; and said each parity-processing unit includes r second lookup tables provided at an output side thereof and configured to convert r updated parity information values into values of the particular function.

* * * * *